United States Patent [19]
Furuno

[11] 3,900,801
[45] Aug. 19, 1975

[54] GAIN CONTROLLED DIFFERENTIAL AMPLIFIER

[75] Inventor: Hiroshi Furuno, Tokyo, Japan

[73] Assignee: Sony Corporation, Tokyo, Japan

[22] Filed: July 29, 1974

[21] Appl. No.: 492,837

[30] Foreign Application Priority Data

Aug. 8, 1973 Japan .......................... 48-93337[U]

[52] U.S. Cl. ................. 330/29; 330/30 D; 330/145
[51] Int. Cl.$^2$ ........................................... H03G 3/30
[58] Field of Search ............. 330/29, 30 D, 69, 145

[56] References Cited

UNITED STATES PATENTS

| | | | |
|---|---|---|---|
| 3,538,448 | 11/1970 | Harford | 330/29 |
| 3,641,450 | 2/1972 | Lunn | 330/29 X |

*Primary Examiner*—James B. Mullins
*Attorney, Agent, or Firm*—Lewis H. Eslinger; Alvin Sinderbrand

[57] ABSTRACT

A gain controlled differential amplifier comprised of amplifying transistors connected in differential amplifier configuration whereby respective emitter electrodes are connected in a common current path. The common current path includes a first control transistor whose conductivity is regulated in accordance with an AGC voltage applied thereto so as to control the gain of the differential amplifier. A second control transistor is connected to the base electrode of one of the amplifying transistors so as to provide a variable conducting path for an input signal applied to such base electrode. The conductivity of the second control transistor is determined in accordance with the AGC voltage applied thereto, whereby the conductivity of both control transistors is regulated by the AGC voltage when the differential amplifier input signal exceeds a predetermined level so as to provide a large range of gain variation for the differential amplifier.

9 Claims, 3 Drawing Figures

GAIN CONTROLLED DIFFERENTIAL AMPLIFIER

BACKGROUND OF THE INVENTION

This invention relates to a differential amplifier and, in particular, to a gain controlled differential amplifier whose amplification is regulated in accordance with an AGC voltage.

Various applications exist for gain controlled amplifiers. In one such application, the gain of, for example, an IF amplifier, as used in a radio receiver, is automatically controlled in accordance with the level of an input signal applied thereto. Such an IF amplifier has been constructed as a differential amplifier. A differential amplifier offers many desirable operating characteristics and, additionally, can be formed as an integrated circuit.

A typical differential amplifier having a controllable gain characteristic and which advantageously can be formed as an integrated circuit includes a pair of amplifying transistors disposed in typical differential amplifier configuration whereby their respective emitter electrodes are connected in common. A base electrode of one of the amplifying transistors serves as an input terminal for the differential amplifier, the base electrode of the other transistor being appropriately biased. The differential amplifier output terminal is connected to the collector electrode of one of the amplifying transistors. To achieve a controllable gain characteristic, a control transistor is coupled to the common connected emitter electrodes so that, as the conductivity of the control transistor varies, the collector-emitter currents of the respective amplifying transistors likewise vary. Hence, if an AGC voltage is applied to the control transistor, the resultant change in the differential amplifier currents results in a corresponding change in the differential amplifier gain.

Although, such prior art differential amplifier offers the advantage that the amplifier gain is not affected by nonuniformity in the base-emitter voltage of the control transistor, and thus does not require a stabilizing circuit or compensating transistors or diodes, such differential amplifier suffers from the attendant disadvantage in that the range of gain variation is undesirably limited. For example, the range of gain reduction attained by such prior art differential amplifier in response to an AGC voltage supplied to the control transistor is approximately 20dB. Hence, such differential amplifier is not well-suited to those applications wherein a wide range of gain variation in response to an AGC signal is necessary.

OBJECTS OF THE INVENTION

Therefore, it is an object of the present invention to provide an improved gain controlled differential amplifier having a gain characteristic that is controlled by an AGC signal.

It is another object of the present invention to provide an improved gain controlled differential amplifier having a wide range of gain variation in response to an AGC signal and having a high AGC loop gain.

A further object of this invention is to provide a differential amplifier including a first control element to change the differential amplifier gain in response to a relatively high control voltage and a second control element to change the differential amplifier gain in response to a relatively low control voltage.

Yet another object of this invention is to provide a differential amplifier having first and second gain control circuits and exhibiting a wide range of gain variation in response to control signals supplied to such first and second control circuits, and wherein the operation of one of such control circuits is delayed with respect to the operation of the other control circuit in response to the same control signal applied to both control circuits.

A still further object of this invention is to provide an improved gain controlled differential amplifier exhibiting a gain variation characteristic that varies smoothly over a wide range, the amplifier gain being controlled in response to a gain control signal.

It is another object of the present invention to provide an improved gain controlled differential amplifier which is readily adapted to be constructed as an integrated circuit.

Various other objects and advantages of the invention will become clear from the ensuing detailed description thereof and the novel features will be particularly pointed out in the appended claims.

SUMMARY OF THE INVENTION

In accordance with the present invention, a gain controlled differential amplifier is formed of amplifying transistors disposed in differential amplifier configuration whereby the transistor emitter electrodes are connected in common to a control transistor; the conductivity of the control transistor is varied in response to a gain control signal applied thereto so as to correspondingly vary the differential amplifier currents; and an additional control transistor is connected to the base electrode of one of the amplifying transistors so as to provide a variable shunt effect in response to the gain control signal; whereby the overall gain of the differential amplifier is varied over a wide range.

BRIEF DESCRIPTION OF THE DRAWINGS

The following detailed description will best be understood in conjunction with the accompanying drawings wherein.

DETAILED DESCRIPTION OF A CERTAIN PREFERRED EMBODIMENT

Figure 1:
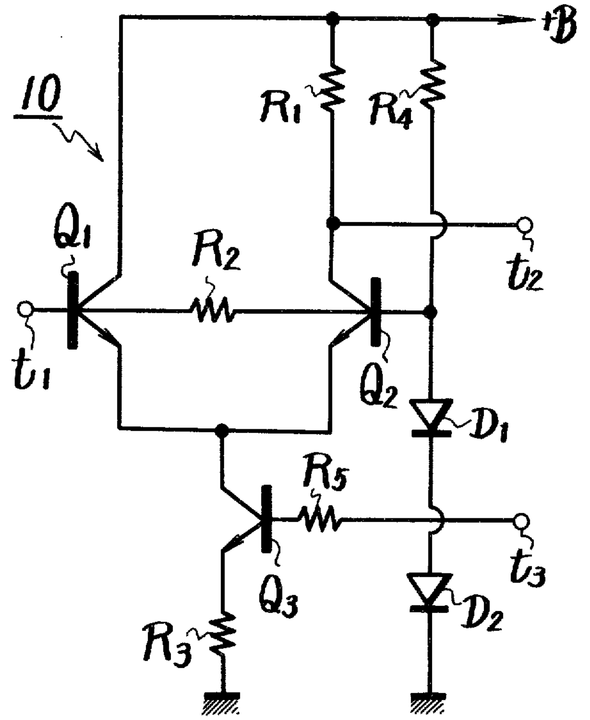
Fig. 1 (PRIOR ART)
FIG. 1 is a schematic diagram of a typical prior art differential amplifier.

Referring now to the drawings, wherein like reference numerals are used throughout and, in particular, to FIG. 1, there is illustrated a schematic representation of a prior art differential amplifier. The differential amplifier 10 is formed of amplifying transistors $Q_1$ and $Q_2$, together with a control transistor $Q_3$. As is illustrated, the amplifying transistors $Q_1$ and $Q_2$ are connected in differential amplifier configuration such that their respective emitter electrodes are connected in common. An amplifier input terminal $t_1$ is connected to the base electrode of one of the amplifying transistors $Q_1$ and an amplifier output terminal $t_2$ is connected to the collector electrode of the amplifying transistor $Q_2$. A source of operating potential +B is connected directly to the collector electrode of the amplifying transistor $Q_1$ and is connected through a resistor $R_1$ to the collector electrode of the amplifying transistor $Q_2$. A bias network formed of the series circuit comprised of a resistor $R_4$ and diodes $D_1$ and $D_2$ is provided for the amplifying transistors. This bias circuit is connected between the source +B and ground. The junction formed by the series connection of the resistor $R_4$ and the diode $D_1$ is connected directly to the base electrode of the amplifying transistor $Q_2$ and, through a bias resistor $R_2$ to the base electrode of the amplifying transistor $Q_1$.

The collector-emitter circuit of the control transistor $Q_3$ is connected in series between the common-connected emitters of the amplifying transistors and ground. This collector-emitter circuit also includes a resistor $R_3$ which is provided to compensate for the reduced output impedance of the control transistor $Q_3$ when such control transistor is operated in saturation. The control transistor $Q_3$ is adapted to exhibit a variable conductivity in response to a control signal applied thereto. Accordingly, the base electrode of the control transistor $Q_3$ is connected to an AGC signal input terminal $t_3$ via a buffer resistor $R_5$.

The illustrated prior art differential amplifier, when used in automatic gain control application, is adapted to exhibit a reduced gain when the input signal applied to terminal $t_1$ increases. Consequently, for such gain controlling applications, the level of the AGC signal applied to the terminal $t_3$ varies inversely as the level of the input signal supplied to the terminal $t_1$. Hence, as the input signal increases in magnitude, the AGC signal decreases. This is achieved by conventional circuitry, not shown. Accordingly, when the input signal exhibits a low level, the AGC voltage supplied to the base electrode of the transistor $Q_3$ is sufficiently large to drive the control transistor to its saturated state. Consequently, maximum current is permitted to flow through the transistor and the respective collector currents of the differential amplifier are relatively large. Accordingly, the differential amplifier exhibits a maximum gain. As the level of the input signal supplied to the input terminal $t_1$ increases, the AGC signal supplied to the terminal $t_3$ decreases. Hence, as the voltage supplied to the base electrode of the control transistor $Q_3$ decreases, the conductivity of the control transistor is reduced. As the current flowing through the control transistor decreases, the differential amplifier gain is reduced.

This prior art differential amplifier is well-suited for applications in AM and FM radio reception. Typically, when used in an AM radio, the illustrated differential amplifier is supplied with an AGC signal; but when the differential amplifier is used in an FM radio, no AGC signal is applied. This prior art differential amplifier, although advantageous from the viewpoint of not requiring any stabilizing circuit or compensating transistors or devices to account for the nonuniformity of the base-emitter voltage of the control transistor, nevertheless admits of an undesirably limited range of gain reduction. Typically, such differential amplifier cannot be controlled to exhibit a gain reduction in excess of 20dB.

Figure 2:
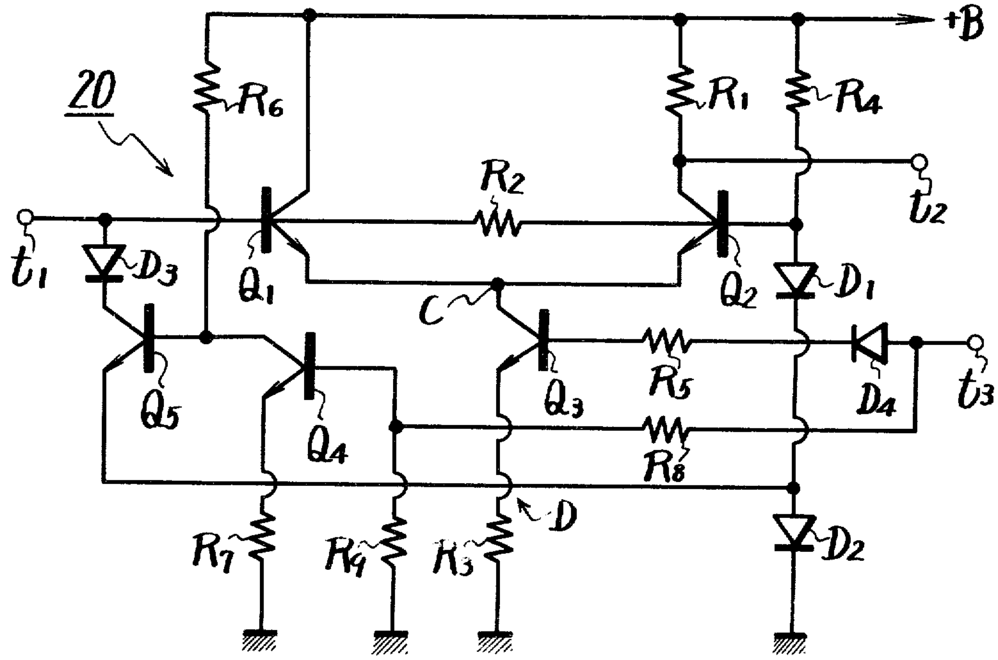
FIG. 2 is a schematic diagram of one embodiment of a gain controlled differential amplifier in accordance with the teachings of the present invention.

The present invention advantageously overcomes the limited gain variation characteristic of the prior art differential amplifier. One embodiment of the present invention is schematically illustrated in FIG. 2. It is seen that the gain controlled differential amplifier 20 of FIG. 2 is comprised of amplifying transistors $Q_1$ and $Q_2$ which are connected in differential amplifier configuration. A control transistor $Q_3$ is connected to the point C at which the emitter electrodes of the amplifying transistors are connected in common. As in the FIG. 1 circuit, the differential amplifier includes an input terminal $t_1$ connected to the base electrode of the amplifying transistor $Q_1$ and an output terminal $t_2$ connected to the collector electrode of the amplifying transistor $Q_2$. Additionally, the base electrode of the control transistor $Q_3$ is coupled to the AGC signal input terminal $t_3$. It is thus seen that the differential amplifier of FIG. 2, as thus far described, is substantially similar to the aforedescribed differential amplifier of FIG. 1. A diode $D_4$ is connected in series between the AGC signal input terminal $t_3$ and the buffer resistor $R_5$.

An additional control transistor $Q_5$ is provided and is adapted to exhibit a variable conductivity in response to the AGC signal supplied to the terminal $t_3$. Such additional control transistor includes collector and emitter electrodes connected in series between the base electrode of the amplifying transistor $Q_1$ and a reference potential, such as ground. Accordingly, the collector-emitter circuit of the control transistor $Q_5$ includes a diode $D_3$ connected in its collector circuit and the diode $D_2$ is connected in its emitter circuit. A variable conducting path is thus seen to extend between the base electrode of the amplifying transistor $Q_1$ through the diode $D_3$, to the collector-emitter circuit of the control transistor $Q_5$ and through the diode $D_2$ to ground.

A further transistor $Q_4$ is connected to the control transistor $Q_5$ and is adapted to supply an amplified AGC signal to the base electrode of the control transistor. Accordingly, the further transistor $Q_4$ includes a collector electrode connected to the base electrode of the control transistor $Q_5$. The transistor $Q_4$ is biased by a collector resistor $R_6$ connected to the source of operating potential +B and by an emitter resistor $R_7$ which is connected to ground. The AGC signal applied to the terminal $t_3$ is supplied to the transistor $Q_4$ by a circuit D comprising a voltage divider network formed of the series connected resistors $R_8$ and $R_9$. This voltage divider network extends between the AGC signal input terminal $t_3$ and ground, and the junction defined by the voltage divider resistors is connected to the base electrode of the transistor $Q_4$.

The diode $D_3$, provided in the collector-emitter circuit of the control transistor $Q_5$, is adapted to lower the voltage across the collector and emitter electrodes of the control transistor. The diode $D_4$, provided in the base circuit of the control transistor $Q_3$, is adapted to initiate the operation of the control transistor $Q_5$ when the AGC signal applied to the terminal $t_3$ is reduced below a predetermined level.

Figure 3:
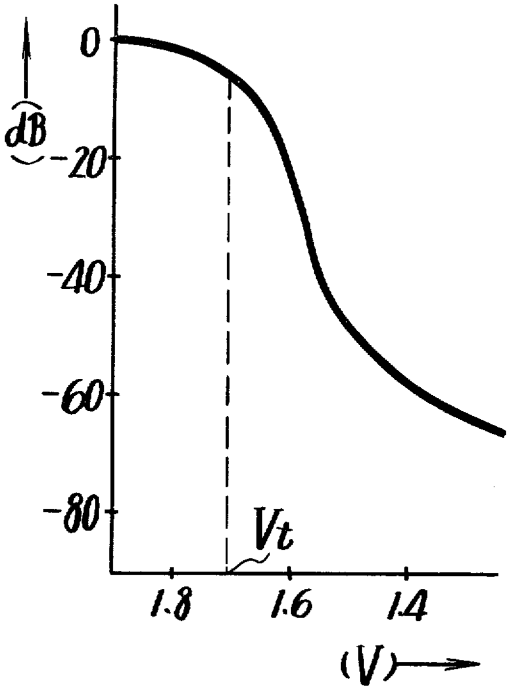
FIG. 3 is a graphical representation illustrating the advantageous operation obtained from the circuit depicted in FIG. 2.

The operation of the improved gain controlled differential amplifier will now be described. The graphical representation of the gain variation characteristic of the differential amplifier, as shown in FIG. 3, will be referred to for the purpose of facilitating an understanding of the advantageous results attained by the present invention. It will be assumed, for the purpose of the present discussion, that the AGC signal applied to the terminal $t_3$ by conventional circuitry (not shown) varies inversely with the magnitude of the input signal applied to the amplifier input terminal $t_1$. Accordingly, as the input signal increases in magnitude, the level of the AGC signal decreases. Conversely, as the magnitude of the input signal decreases, the AGC signal level increases.

When the input signal applied to the amplifier input terminal $t_1$ admits of a low magnitude, it is recognized that the AGC voltage applied to the AGC signal input terminal $t_3$ is a high level. As a numerical example, the AGC voltage is approximately 1.9 volts and the gain of the differential amplifier may be assumed to be a maximum. Hence, the amount of gain reduction in response to this AGC signal (of 1.9 volts magnitude) is OdB. With a high level AGC voltage applied to the base electrode of the control transistor $Q_3$, this control transistor admits of its saturated condition. In addition, a portion of the AGC voltage, after being reduced by the voltage divider network formed of resistors $R_8$ and $R_9$, is applied to the base electrode of the transistor $Q_4$ and admits of sufficient magnitude to render this transistor conductive. It is appreciated that, as the transistor $Q_4$ conducts, a current path extends from the source +B through the resistor $R_6$, through the collector-emitter junction of the transistor $Q_4$ and through the resistor $R_7$ to ground. Accordingly, the voltage now present at the collector electrode of the transistor $Q_4$ and applied to the base electrode of the control transistor $Q_5$ is not sufficient to render the control transistor conductive. As an example, the collector voltage of the transistor $Q_4$ is approximately 0.7 to 0.8 maximum. In view of the voltage drop across the diode $D_2$, it is recognized that the voltage appearing at the emitter electrode of the transistor $Q_5$ is not sufficient to result in a base-emitter voltage that is adequate to turn on the control transistor $Q_5$.

Now, if the magnitude of the input signal supplied to the amplifier input terminal $t_1$ increases, it is appreciated that the AGC voltage applied to the terminal $t_3$ thereafter decreases. Consequently, the control transistor $Q_3$ is rendered less conductive such that the currents flowing through the amplifying transistors $Q_1$ and $Q_2$ to ground through the control transistor $Q_3$ decrease. It is thus appreciated that the gain of the amplifier also decreases. If it is further assumed that the AGC voltage has decreased to a level of, for example, approximately 1.7 volts, it is recognized that the voltage drop across the diode $D_4$ and the base-emitter voltage of the control transistor $Q_3$ are such to reduce the collector current flowing through the control transistor to a relatively small value. Accordingly, the gain of the differential amplifier is reduced, as depicted in FIG. 3.

If this AGC voltage of approximately 1.7 volts is assumed to correspond to a threshold voltage, then the portion of this AGC voltage that is applied to the base electrode of the transistor $Q_4$ results in a collector voltage at that transistor approximately 1.3 to 1.4 volts. This voltage, applied to the base electrode of the control transistor $Q_5$, is now sufficient to result in a base-emitter voltage drop that renders this control transistor conductive. In addition, the diode $D_3$ is rendered conductive such that a conducting path is provided between the base electrode of the transistor $Q_1$ and ground via the conducting diode $D_3$, transistor $Q_5$ and diode $D_2$. Thus, the base voltage of the amplifying transistor $Q_1$ becomes small as compared to the base voltage of the amplifying transistor $Q_2$. Accordingly, the collector current of the amplifying transistor $Q_1$ rapidly decreases to further lower the gain of the differential amplifier.

As the AGC voltage applied to the AGC signal input terminal $t_3$ further decreases (that is, as the magnitude of the input signal supplied to the amplifier input terminal $t_1$ increases) the control transistor $Q_5$ is rendered further conductive so as to reduce the collector-emitter impedence thereof. Consequently, the gain of the differential amplifier is seen to further decrease. However, since the voltage applied to the base electrode of the transistor $Q_4$ is reduced by the voltage dividing network formed of the resistors $R_8$ and $R_9$, it is appreciated that the collector voltage of the transistor $Q_4$ does not change as rapidly as does the conductivity of the control transistor $Q_3$. This obtains because the AGC voltage applied to the base electrode of the control transistor $Q_3$ is not supplied thereto through a voltage divider network. Therefore, the conductivity of the control transistor $Q_5$ does not increase as rapidly as the conductivity of the control transistor $Q_3$ decreases. The gradual change of the conductivity of the control transistor $Q_5$ following the reduction of the collector currents of the amplifying transistors $Q_1$ and $Q_2$ results in a smooth variation in the amplifier gain.

It is now appreciated that, in the gain controlled differential amplifier of the present invention, the first control transistor is rendered operative to vary the amplifier gain when the magnitude of the input signal is less than a predetermined level; whereas both control transistors are operative to vary the amplifier gain when the magnitude of the input signal exceeds such predetermined level. Stated otherwise, and with reference to the schematic illustration of FIG. 2, the control transistor $Q_3$ operates when the AGC signal applied to the AGC signal input terminal $t_3$ exceeds a predetermined level and both the control transistor $Q_3$ and the control transistor $Q_5$ operate when such AGC signal is less than the predetermined level. Thus, the improved differential amplifier of the present invention admits of a relatively simple construction, while not having a gain characteristic that is susceptible to change even if the base-emitter voltages of the control transistors are nonuniform. In addition, the AGC loop gain preferably can be made relatively high. Furthermore, since the base voltage of the amplifying transistor $Q_1$ is reduced towards ground voltage level after the collector currents of the amplifying transistors decrease, the improved differential amplifier becomes unbalanced to thereby greatly reduce its gain. It is also seen that undesirably rapid changes in the differential amplifier gain in response to the gain control signal are avoided because the operation of the control transistor $Q_5$ is delayed by reason of the voltage divider network.

While the present invention has been particularly shown and described with reference to a certain preferred embodiment thereof, it will be obvious to those of ordinary skill in the art that various changes and modifications in form and details may be made without departing from the spirit and scope of the invention. For example, a load can be connected to the collector electrode of the amplifying transistor $Q_1$, and the amplifier output terminal $t_2$ can be connected to such collector electrode. Also, the gain controlled differential amplifier admits of numerous applications and need not be limited solely for use in a radio receiver. It is, therefore, intended that the appended claims be interpreted as including the foregoing as well as other changes and modifications.

What is claimed is:

1. A differential amplifier, comprising:

first and second amplifying transistor means connected in differential amplifier configuration and having respective emitter electrodes connected in common, one of said first and second amplifying transistor means being provided with a signal input terminal and the other of said first and second amplifying transistor means being provided with a signal output terminal;

a control input terminal for receiving a control signal;

first control means connected to said common connected emitter electrodes and coupled to said control input terminal for receiving said control signal, said first control means being responsive to said control signal applied thereto for varying the currents flowing through said first and second amplifying transistor means; and second control means connected to the base electrode of said one amplifying transistor means provided with said input terminal and coupled to said control input terminal for receiving said control signal, said second control means being responsive to said control signal applied thereto to vary the voltage at said base electrode and to thereby vary the gain of said differential amplifier.

2. A differential amplifier in accordance with claim 1 wherein said second control means includes means to which said control signal is applied to cause said second control means to operate at a control signal level that differs from the operating level of said first control means such that one of said first and second control means operates before the other in response to the same control signal.

3. A differential amplifier in accordance with claim 2 wherein said means included in said second control means comprises voltage divider means to which said control signal is applied, the output of said voltage divider means causing said second control means to operate.

4. A differential amplifier in accordance with claim 3 wherein said first control means comprises a first control transistor having its collector-emitter circuit connected in series with said common connected emitter electrodes and its base electrode supplied with said control signal; and wherein said second control means includes a second control transistor having its collector-emitter circuit connected in shunt relationship with said base electrode of said one amplifying transistor means and its base electrode supplied with the output of said voltage divider means.

5. A differential amplifier in accordance with claim 1, further comprising an AGC signal input terminal for receiving an AGC signal; and wherein said first control means comprises a first control transistor having its collector-emitter circuit connected in series with said common connected emitters and its base electrode coupled to said AGC signal input terminal; and wherein said second control means comprises a second control transistor having its collector-emitter circuit connected in a shunt circuit coupled to said differential amplifier signal input terminal and its base electrode coupled to said AGC signal input terminal.

6. A differential amplifier in accordance with claim 5 wherein said second control means further comprises AGC voltage divider means coupled to said AGC signal input terminal and means for supplying the output of said voltage divider means to the base electrode of said second control transistor such that, as said AGC signal varies, said first control transistor is activated before said second control transistor is activated.

7. A differential amplifier in accordance with claim 6 wherein said shunt circuit includes a first diode connected in the collector circuit of said second control transistor and a second diode connected in the emitter circuit of said second control transistor.

8. A differential amplifier in accordance with claim 1 further comprising a bias circuit formed of resistance means connected in series with diode means to form a junction at which a bias voltage is produced, said bias voltage being supplied to the respective base electrodes of said first and second amplifying transistor means.

9. A differential amplifier, comprising:

first and second amplifying transistors connected in differential amplifier configuration and having their respective emitter electrodes connected in common, the base electrode of said first amplifying transistor being connected to a signal input terminal and the collector electrode of said second amplifying transistor being connected to a signal output electrode;

a first control transistor having its collector-emitter circuit connected in series with said common connected emitter electrodes;

a second control transistor having its collector-emitter circuit connected in a series circuit between said first amplifying transistor base electrode and a reference potential; and means for supplying an AGC voltage to said first and second control transistors such that said first control transistor is conductive when an input signal supplied to said signal input terminal is less than a predetermined level and both said first and second control transistors are conductive when said input signal exceeds said predetermined level.

* * * * *

UNITED STATES PATENT OFFICE
CERTIFICATE OF CORRECTION

Patent No. 3,900,801 Dated August 19, 1975

Inventor(s) Hiroshi Furuno

It is certified that error appears in the above-identified patent and that said Letters Patent are hereby corrected as shown below:

Columns 3 and 4 as shown on the attached sheet should be added, but will apply to the grant only.

Signed and Sealed this

*twentieth* Day of *April 1976*

[SEAL]

*Attest:*

RUTH C. MASON
*Attesting Officer*

C. MARSHALL DANN
*Commissioner of Patents and Trademarks* rectly to the collector electrode of the amplifying transistor $Q_1$ and is connected through a resistor $R_1$ to the collector electrode of the amplifying transistor $Q_2$. A bias network formed of the series circuit comprised of a resistor $R_4$ and diodes $D_1$ and $D_2$ is provided for the amplifying transistors. This bias circuit is connected between the source +B and ground. The junction formed by the series connection of the resistor $R_4$ and the diode $D_1$ is connected directly to the base electrode of the amplifying transistor $Q_2$ and, through a bias resistor $R_2$ to the base electrode of the amplifying transistor $Q_1$.

The collector-emitter circuit of the control transistor $Q_3$ is connected in series between the common-connected emitters of the amplifying transistors and ground. This collector-emitter circuit also includes a resistor $R_3$ which is provided to compensate for the reduced output impedance of the control transistor $Q_3$ when such control transistor is operated in saturation. The control transistor $Q_3$ is adapted to exhibit a variable conductivity in response to a control signal applied thereto. Accordingly, the base electrode of the control transistor $Q_3$ is connected to an AGC signal input terminal $t_3$ via a buffer resistor $R_5$.

The illustrated prior art differential amplifier, when used in automatic gain control application, is adapted to exhibit a reduced gain when the input signal applied to terminal $t_1$ increases. Consequently, for such gain controlling applications, the level of the AGC signal applied to the terminal $t_3$ varies inversely as the level of the input signal supplied to the terminal $t_1$. Hence, as the input signal increases in magnitude, the AGC signal decreases. This is achieved by conventional circuitry, not shown. Accordingly, when the input signal exhibits a low level, the AGC voltage supplied to the base electrode of the transistor $Q_3$ is sufficiently large to drive the control transistor to its saturated state. Consequently, maximum current is permitted to flow through the transistor and the respective collector currents of the differential amplifier are relatively large. Accordingly, the differential amplifier exhibits a maximum gain. As the level of the input signal supplied to the input terminal $t_1$ increases, the AGC signal supplied to the terminal $t_3$ decreases. Hence, as the voltage supplied to the base electrode of the control transistor $Q_3$ decreases, the conductivity of the control transistor is reduced. As the current flowing through the control transistor decreases, the differential amplifier gain is reduced.

This prior art differential amplifier is well-suited for applications in AM and FM radio reception. Typically, when used in an AM radio, the illustrated differential amplifier is supplied with an AGC signal; but when the differential amplifier is used in an FM radio, no AGC signal is applied. This prior art differential amplifier, although advantageous from the viewpoint of not requiring any stabilizing circuit or compensating transistors or devices to account for the nonuniformity of the base-emitter voltage of the control transistor, nevertheless admits of an undesirably limited range of gain reduction. Typically, such differential amplifier cannot be controlled to exhibit a gain reduction in excess of 20dB.

The present invention advantageously overcomes the limited gain variation characteristic of the prior art differential amplifier. One embodiment of the present invention is schematically illustrated in FIG. 2. It is seen that the gain controlled differential amplifier 20 of FIG. 2 is comprised of amplifying transistors $Q_1$ and $Q_2$ which are connected in differential amplifier configuration. A control transistor $Q_3$ is connected to the point C at which the emitter electrodes of the amplifying transistors are connected in common. As in the FIG. 1 circuit, the differential amplifier includes an input terminal $t_1$ connected to the base electrode of the amplifying transistor $Q_1$ and an output terminal $t_2$ connected to the collector electrode of the amplifying transistor $Q_2$. Additionally, the base electrode of the control transistor $Q_3$ is coupled to the AGC signal input terminal $t_3$. It is thus seen that the differential amplifier of FIG. 2, as thus far described, is substantially similar to the aforedescribed differential amplifier of FIG. 1. A diode $D_4$ is connected in series between the AGC signal input terminal $t_3$ and the buffer resistor $R_5$.

An additional control transistor $Q_5$ is provided and is adapted to exhibit a variable conductivity in response to the AGC signal supplied to the terminal $t_3$. Such additional control transistor includes collector and emitter electrodes connected in series between the base electrode of the amplifying transistor $Q_1$ and a reference potential, such as ground. Accordingly, the collector-emitter circuit of the control transistor $Q_5$ includes a diode $D_3$ connected in its collector circuit and the diode $D_2$ is connected in its emitter circuit. A variable conducting path is thus seen to extend between the base electrode of the amplifying transistor $Q_1$ through the diode $D_3$, to the collector-emitter circuit of the control transistor $Q_5$ and through the diode $D_2$ to ground.

A further transistor $Q_4$ is connected to the control transistor $Q_5$ and is adapted to supply an amplified AGC signal to the base electrode of the control transistor. Accordingly, the further transistor $Q_4$ includes a collector electrode connected to the base electrode of the control transistor $Q_5$. The transistor $Q_4$ is biased by a collector resistor $R_6$ connected to the source of operating potential +B and by an emitter resistor $R_7$ which is connected to ground. The AGC signal applied to the terminal $t_3$ is supplied to the transistor $Q_4$ by a circuit D comprising a voltage divider network formed of the series connected resistors $R_8$ and $R_9$. This voltage divider network extends between the AGC signal input terminal $t_3$ and ground, and the junction defined by the voltage divider resistors is connected to the base electrode of the transistor $Q_4$.

The diode $D_3$, provided in the collector-emitter circuit of the control transistor $Q_5$, is adapted to lower the voltage across the collector and emitter electrodes of the control transistor. The diode $D_4$, provided in the base circuit of the control transistor $Q_3$, is adapted to initiate the operation of the control transistor $Q_5$ when the AGC signal applied to the terminal $t_3$ is reduced below a predetermined level.

The operation of the improved gain controlled differential amplifier will now be described. The graphical representation of the gain variation characteristic of the differential amplifier, as shown in FIG. 3, will be referred to for the purpose of facilitating an understanding of the advantageous results attained by the present invention. It will be assumed, for the purpose of the present discussion, that the AGC signal applied to the terminal $t_3$ by conventional circuitry (not shown) varies inversely with the magnitude of the input signal applied to the amplifier input terminal $t_1$. Accordingly, as the input signal increases in magnitude, the level of the AGC signal decreases. Conversely, as the magnitude of